US012700821B2

(12) United States Patent　　(10) Patent No.: US 12,700,821 B2
Goodman et al.　　(45) Date of Patent: Aug. 4, 2026

(54) SPATIALLY-SHAPED PHOTOVOLTAIC SCREEN SYSTEM

(71) Applicant: Karogen LLC, Delray Beach, FL (US)

(72) Inventors: Kathy E. Goodman, Delray Beach, FL (US); Robert Sunstone, North Palm Beach, FL (US)

(73) Assignee: KAROGEN LLC, Delray Beach, FL (US)

( * ) Notice: Subject to any disclaimer, the term of this patent is extended or adjusted under 35 U.S.C. 154(b) by 0 days.

(21) Appl. No.: 19/381,075

(22) Filed: Nov. 6, 2025

(65) Prior Publication Data

US 2026/0074645 A1　Mar. 12, 2026

Related U.S. Application Data

(63) Continuation of application No. 18/829,421, filed on Sep. 10, 2024, now Pat. No. 12,489,391.

(51) Int. Cl.
| *H02S 20/26* | (2014.01) |
| *E06B 9/24* | (2006.01) |
| *E06B 9/52* | (2006.01) |
| *H10F 19/85* | (2025.01) |

(52) U.S. Cl.
CPC ............... *H02S 20/26* (2014.12); *E06B 9/52* (2013.01); *E06B 2009/2476* (2013.01); *H10F 19/85* (2025.01)

(58) Field of Classification Search
CPC .................................. H02S 20/26; E06B 9/52
See application file for complete search history.

(56) References Cited

FOREIGN PATENT DOCUMENTS

WO　WO-2020091290 A1 *　5/2020　............... E06B 9/42

OTHER PUBLICATIONS

English machine translation of WO2020091290A1. (Year: 2020).*

* cited by examiner

*Primary Examiner* — Lindsey A Buck

(74) *Attorney, Agent, or Firm* — Peter J. Van Bergen

(57) ABSTRACT
A photovoltaic screen system is an integrated structure disposed over an opening in a wall of a building. The integrated structure includes a screen that is permeable to light and air, a photovoltaic (PV) element coupled to a portion of the screen, and a frame coupled to the screen and PV element. The frame is adapted to be attached to the building and includes a portion occupying a three-dimensional geometry extending outward from the opening in the wall so that the screen and PV element lie along a perimeter of the three-dimensional geometry.

15 Claims, 10 Drawing Sheets

SPATIALLY-SHAPED PHOTOVOLTAIC SCREEN SYSTEM

This is a continuation of application Ser. No. 18/829,421, filed Sep. 10, 2024.

FIELD OF THE DISCLOSURE

This disclosure relates generally to photovoltaic systems, and more particularly to methods and systems for integrating photovoltaic materials with air-and-light passing screens for installation in building openings.

BACKGROUND

In the new millennium, solar power has emerged as one of the principle renewable energy sources. Currently, solar power may be generated by large scale installations known as "solar farms" where large solar panels are arrayed over a large tract of land with the generated electricity being stored and distributed for use by energy customers. On a smaller scale, solar panels may be mounted on the roofs of commercial and residential structures to generally provide electrical energy for the particular structure and its occupants. However, the cost associated with the purchase and installation of residential solar systems is still prohibitively high for most home owners around the world. In addition, current roof-mounted solar systems detract from the aesthetics of homes and other buildings. Still further, renters of apartment units and condominium owners/renters generally have no access to their roof tops or even have a balcony to install solar panels. Therefore, there are large segments of the population that are unable to take advantage of the benefits and savings associated with the use of solar energy.

SUMMARY

Accordingly, it is an object of the present disclosure to describe methods and systems for photovoltaic screens that may be disposed over an opening in a wall of a structure to provide for the passage of light and air while also providing for the collection and conversion of solar energy to electrical energy.

Other objects and advantages of the methods and systems described herein will become more obvious hereinafter in the specification and drawings.

In accordance with methods and systems described herein, a photovoltaic screen system is an integrated structure adapted to be disposed over an opening in a wall of a building. The integrated structure includes a screen that is permeable to light and air, a photovoltaic (PV) element coupled to a portion of the screen, and a frame coupled to the screen and the PV element. The frame is adapted to be attached to the building. The frame includes a portion occupying a three-dimensional geometry extending outward from the opening in the wall wherein the screen and the PV element lie along a perimeter of the three-dimensional geometry.

BRIEF DESCRIPTION OF THE DRAWINGS

Other objects, features and advantages of the methods and systems described in the present disclosure will become apparent upon reference to the following description of the preferred embodiments and to the drawings, wherein corresponding reference characters indicate corresponding parts throughout the several views of the drawings and wherein.

DETAILED DESCRIPTION

The present disclosure describes a new approach to solar energy collection for conversion into electrical energy. In general, the present disclosure describes a photovoltaic (PV) screen system that may be disposed over a wall opening of a building where the PV screen system passes light and air, while also collecting and converting solar energy to electrical energy. In some embodiments, the PV screen system may serve as a barrier to insects and/or preserve privacy for a building's occupants. The building may be a commercial or residential building, and the opening may be a window, a door, the wall of a porch, etc. As will be described further below, the PV screen system presents a simple and inexpensive system that may be readily incorporated into existing or new buildings. Solar-to-electrical energy generation may be accomplished on a small or large scale depending on the number of building openings that are equipped with the PV screen system as well as the solar collection area presented by the PV screen system.

As used herein, the term "photovoltaic (or PV) element" refers to any of a variety of well-known pre-fabricated or printed materials, cells, modules, structures, etc., that convert solar energy to electric energy when the PV element is exposed to solar energy. The particular choice of materials and constructions for the PV elements are not limitations of the present disclosure.

As used herein, the term "screen" refers to any mesh-like structure that is permeable to light and air. In some embodiments, the screen(s) in the PV screen system also serve as an insect barrier. In some embodiments, the screen(s) used in the PV screen system may be commercially-available screen materials in, for example, sheet form. In some embodiments and as will be described later herein, the screen(s) may be created as part of the PV screen system's fabrication process. In some embodiments, the screen(s) may be made from materials/components used for encapsulation of the PV elements and/or backsheet laminate materials as will be described later herein.

Figure 1:
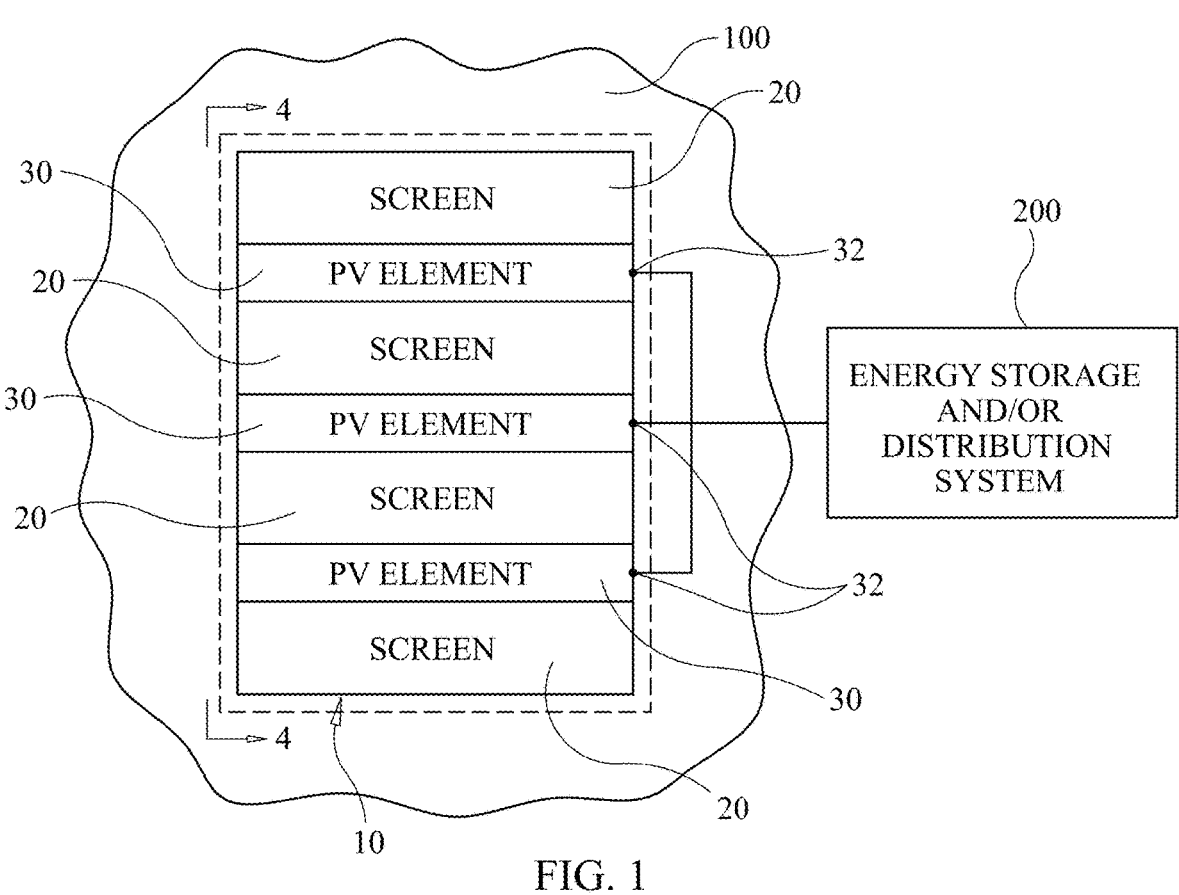
FIG. 1 is a schematic view of an embodiment of a photovoltaic screen system in accordance with various aspects as described herein.

Referring now to the drawings and more particularly to FIG. 1, a schematic view of an embodiment of a PV screen system is shown and is referenced generally by numeral 10. PV screen system 10 is an integrated structure that is disposed over a wall opening 102 (illustrated by dashed lines) in a building 100. PV screen system 10 may be disposed completely or partially over opening 102 without departing from the scope of the present disclosure. While some or all of opening 102 would typically be covered by PV screen system 10, opening 102 is fully visible in the figures to facilitate an understanding of the present disclosure.

PV screen system 10 includes one or more screens 20 coupled to one or more PV elements 30. In the illustrated embodiment, screens 20 and PV elements 30 are arranged to present as alternating or interleaving strips (e.g., PV elements 30 are strips of PV materials or structures). Screens 20 and PV elements 30 may be disposed horizontally (as shown), vertically, at angles between horizontal and vertical, or using combinations thereof, without departing from the scope of the present disclosure.

As mentioned above, PV elements 30 collect and convert solar energy to electrical energy. In some embodiments, the electrical energy is low voltage (e.g., 12 volts DC). The mechanisms for such collection and conversion are well-known in the art and are not part of, or limitations on, the present disclosure. The electrical energy may be provided to a local energy storage and/or distribution (ESD) system 200, the design of which is not a limitation of the present disclosure. ESD system 200 may be electrically connected to PV elements 30 at, for example, electrical connections 32 (e.g., terminals, bus bars, etc.) and may include electrical components (e.g., charge regulators) needed for the system it supports as would be understood in the art. In some embodiments, ESD system 200 may be dedicated and locally positioned relative to PV screen system 10. In such cases, the electrical energy may be sufficient to power/charge, for example, phones, tablets, laptops fans, lights, and batteries (not shown). In some embodiments, ESD system 200 may be located at a central location within a given unit in building 100 or may have a number of PV screen systems connected thereto for energy storage and distribution to users in the unit and/or throughout the building.

Figure 2:
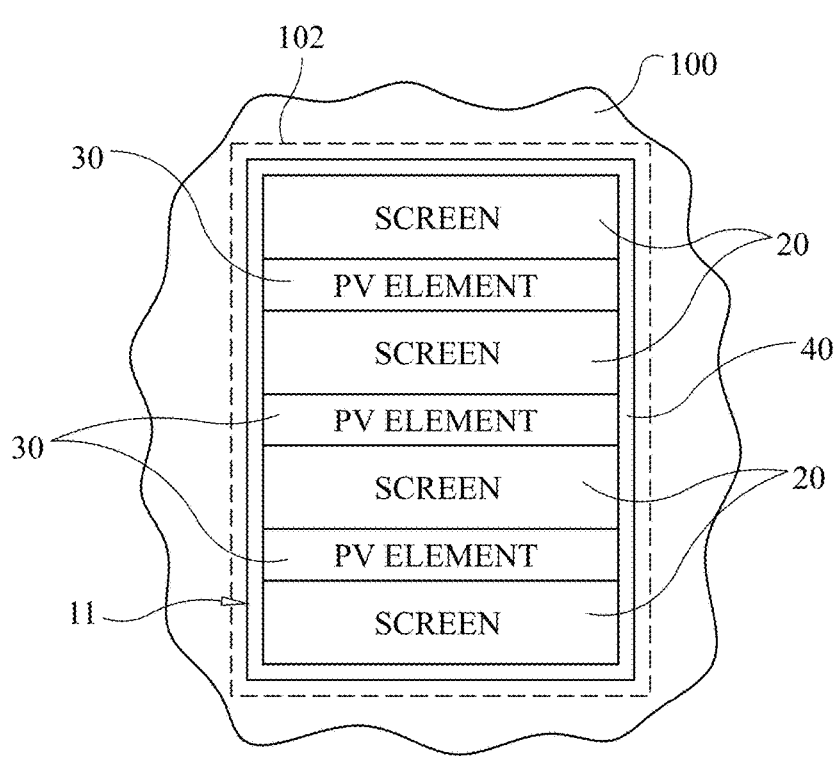
FIG. 2 is a schematic view of another embodiment of a photovoltaic screen system that includes a frame in accordance with various aspects as described herein.

In some embodiments, PV screen system 10 may be fabricated for direct mounting to building 100 at its opening 102. However, in some embodiments, it may be desirable to include a frame as part of the PV screen system to simplify the handling, mounting, etc., of the PV screen system. Accordingly, and with reference to FIG. 2, another embodiment of a PV screen system is shown and is referenced generally by numeral 11. PV screen system 11 is also an integrated structure that further includes a frame 40 providing mechanical support for screens 20 and PV elements 30. Frame 40 may define the perimeter of PV screen system 11. However, frame 40 may also include one or more cross members (not shown) for mechanical stability. In some embodiments, frame 40 may also provide support electrical wiring, bus bars, etc. (not shown) used to electrically connect PV elements 30 to an ESD system as described above.

Figure 3A:
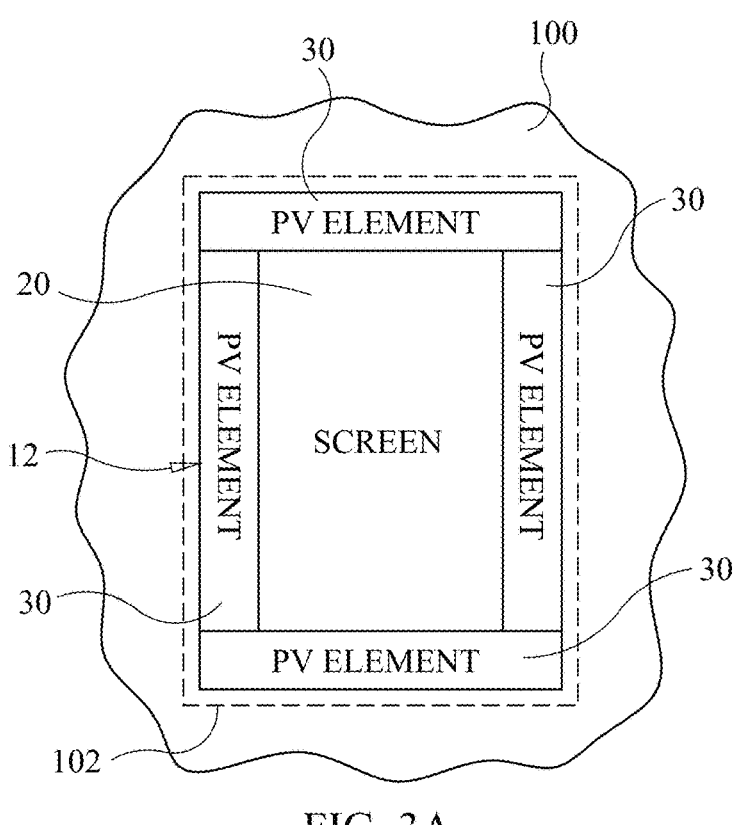
FIG. 3A is a schematic view of another embodiment of a photovoltaic screen system having a border made from photovoltaic elements in accordance with various aspects as described herein.
Figure 3B:
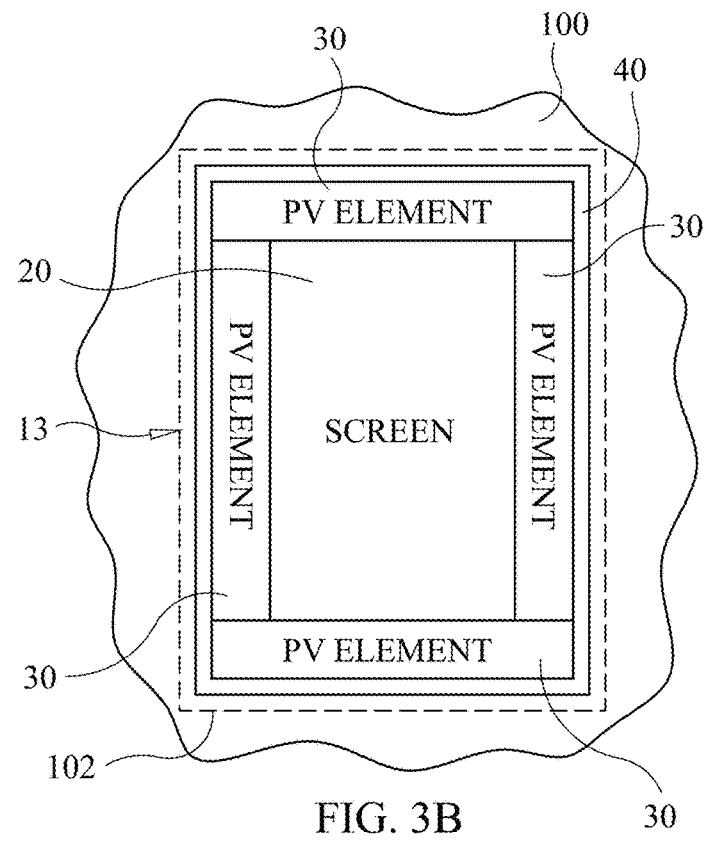
FIG. 3B is a schematic view of another embodiment of a photovoltaic screen system that includes a frame in accordance with various aspects as described herein.

The PV screen system of the present disclosure is not limited to an alternating/interleaved arrangement of screens and PV elements. For example and with reference to FIG. 3A, another embodiment of a PV screen system is shown and is referenced generally by numeral 12. PV screen system 12 has its PV elements 30 disposed in a picture-frame arrangement that surrounds and is coupled to screen 20. In some embodiments, the frame-like arrangement of PV elements 30 may be sufficient to provide the mechanical support needed for the PV screen system. In cases where additional mechanical and/or electrical wiring support is needed, another embodiment of a PV screen system is shown in FIG. 3B and is referenced generally by numeral 13 where a frame 40 is coupled to and disposed about PV elements 30 in their picture-frame arrangement.

Figure 4A:
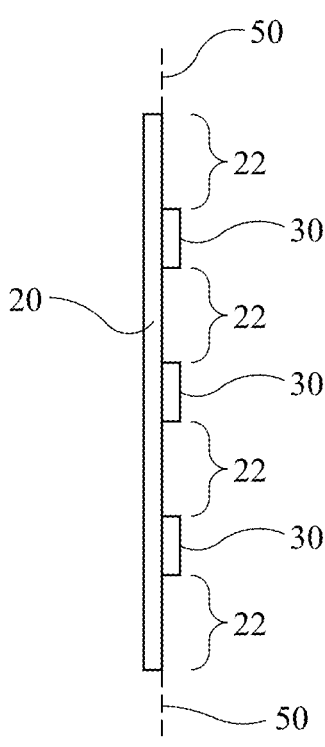
FIG. 4A is a side schematic view of an embodiment of a photovoltaic screen system taken along line 4-4 in FIG. 1 in accordance with various aspects as described herein.
Figure 4B:
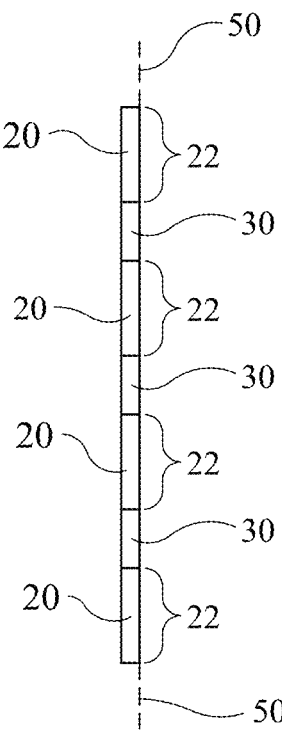
FIG. 4B is a side schematic view of another embodiment of a photovoltaic screen system taken along line 4-4 in FIG. 1 in accordance with various aspects as described herein.

The coupling of the screen(s) and PV element(s) to one another may be accomplished in a variety of ways without departing from the scope of the present disclosure. Two such non-limiting screen-to-PV element coupling embodiments are illustrated in FIGS. 4A-4B which are side views taken along line 4-4 in FIG. 1. In FIG. 4A, screen 20 may be a single sheet of screen material whose mesh areas 22 between PV elements 30 may be pre-fabricated or generated during the manufacture of the PV screen system. For purpose of illustration, the thicknesses of screen 20 and PV elements 30 are exaggerated. PV elements 30 are coupled to one face (e.g., facing the exterior of the building) of screen 20. In some embodiments, screen 20 may be fabricated (i.e., inclusive of its screen perforations at least in the regions between PV elements 30) using what is known in the art as a "backsheet laminate" that may be made from a variety of materials and that may be colored, transparent, etc., without departing form the scope of the present disclosure. In FIG. 4B, multiple pieces or sections of screen 20 are coupled at their edges to PV elements 30 to form the above-described interleaved screen system.

In the embodiments shown in FIGS. 4A-4B, the screen and PV elements lie in the same plane or occupy a planar space as indicated by dashed line 50. However, in some embodiments, the PV screen system's screens and PV elements may be positioned to occupy a non-planar space where the PV elements may be disposed at a fixed or adjustable skyward tilted angle to optimize exposure to the sun. For example and with reference to the side view illustrated in FIG. 5A, PV elements 30 are separated from one another and are arranged in parallel planes 52 where each plane 52 is at an acute angle $\alpha$ (also referred to herein as "tilt angle") relative to a horizontal plane referenced by dashed line 302. As is known in the art, the horizontal plane 302 is any surface or plane that is parallel to the Earth's surface on a 0° degree angle. Accordingly, a plane that is perpendicular the horizontal plane 302 is called a vertical plane. In terms of the building 100, the walls of the building to include each opening 102 are considered to lie in vertical planes, while each floor of the building is considered to lie in a horizontal plane.

In general, the angle $\alpha$ tilts each PV element 30 such that their solar collecting faces are tilted skyward so that solar energy from the sun 300 impinges on the PV elements' solar collecting faces. In the illustrated embodiment, when PV elements 30 are tilted skyward, screens 20 are tilted towards the ground surface 304. Larger values of angle $\alpha$ may be appropriate when the sun 300 is lower in the sky (e.g., early morning, late afternoon, Winter etc.), while smaller values of angle $\alpha$ may be appropriate when the sun 300 is higher in the sky (e.g. midday, Summer, etc.).

In some embodiments, a vertical plane such as the plane of the opening 102 may be utilized to measure the skyward tilting angle of the PV elements. Referring again to FIG. 5A, the angle $\beta$ may be used to define the tilt angle between the parallel planes 52 and the verticality of the opening 102 and, typically, the plane of frame 40. Given the perpendicular relationship between the above-described horizontal and vertical planes, the angles $\alpha$ and $\beta$ are complementary angles.

Figure 5A:
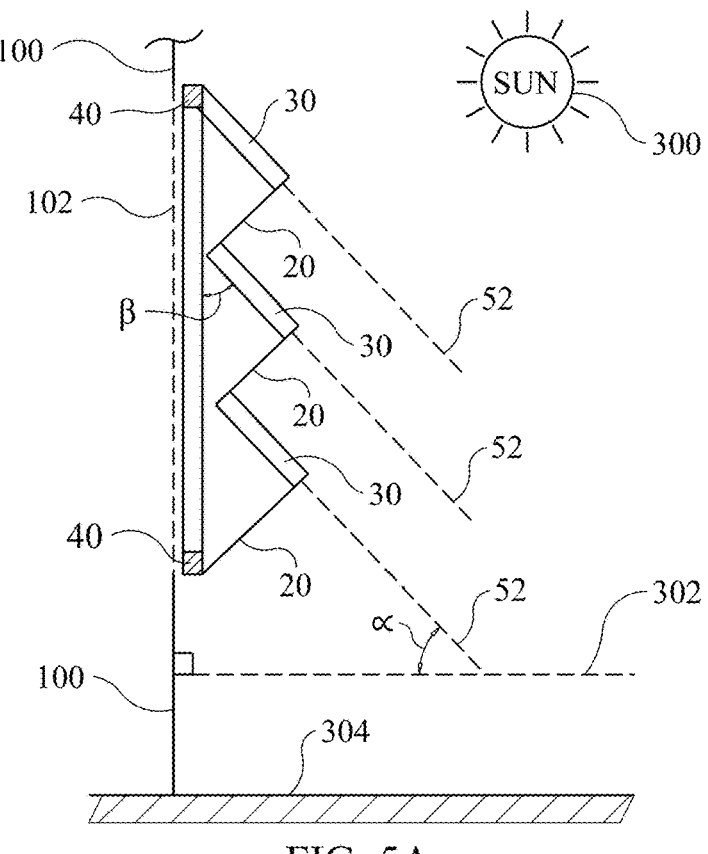
FIG. 5A is a side schematic view of an embodiment of a photovoltaic screen system with its photovoltaic elements angled to tilt skyward in accordance with various aspects as described herein.

The tilt angle of a PV element relative to the horizontal (or vertical) plane affects the amount sunlight it receives. The optimum tilt angle is primarily dependent on the latitude of the location where the PV element is deployed. FIG. 5A illustrates the acute angle $\alpha$ as it is formed between the horizontal plane 302 (e.g., a floor of the building 100) and a given plane 52 associated with the tilted PV elements 30. The angle $\alpha$ for parallel planes 52 may be pre-set at system fabrication for a given location of deployment based on the latitude of the location. However, there may be instances where a user may want to fine tune angle $\alpha$ for an installation's latitude, for the four seasons, etc., in which case an angle adjustment mechanism may be included as part of the PV screen system as will be explained further below.

Figure 5B:
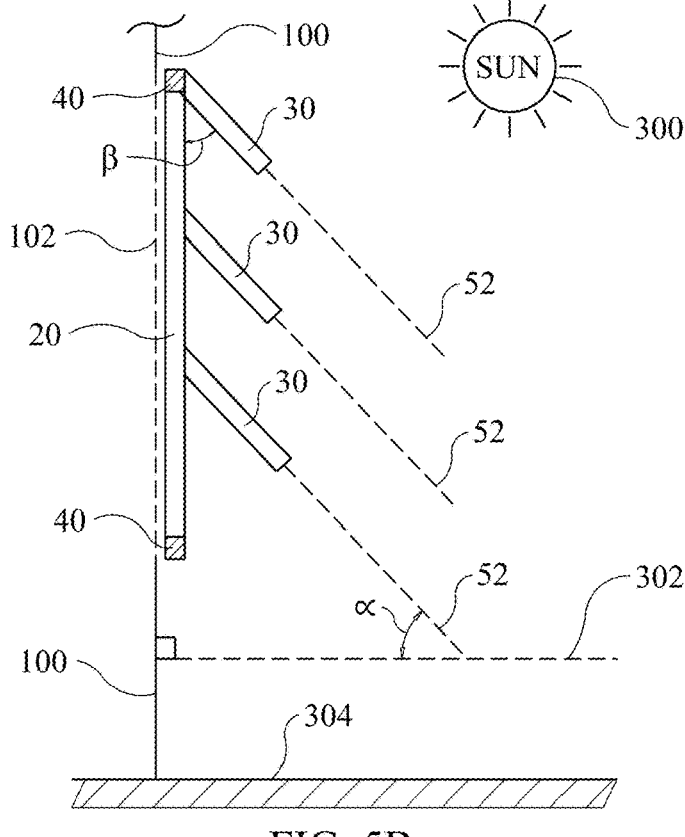
FIG. 5B is a side schematic view of another embodiment of a photovoltaic screen system with its photovoltaic elements angled to tilt skyward in accordance with various aspects as described herein.

In the example illustrated in FIG. 5A, frame 40 may be configured to fix screens 20 and PV elements 30 in the above-described non-planar space. In some embodiments, frame 40 may include members (not shown) to retain the angular relationship between the screens and PV elements. In some embodiments and as shown in FIG. 5B, the PV screen system may be configured such that only PV elements 30 are tilted relative to screen 20 to face skyward to better receive solar energy from the sun 300, while screen 20 remains fixed in its orientation across opening 102.

Figure 6:
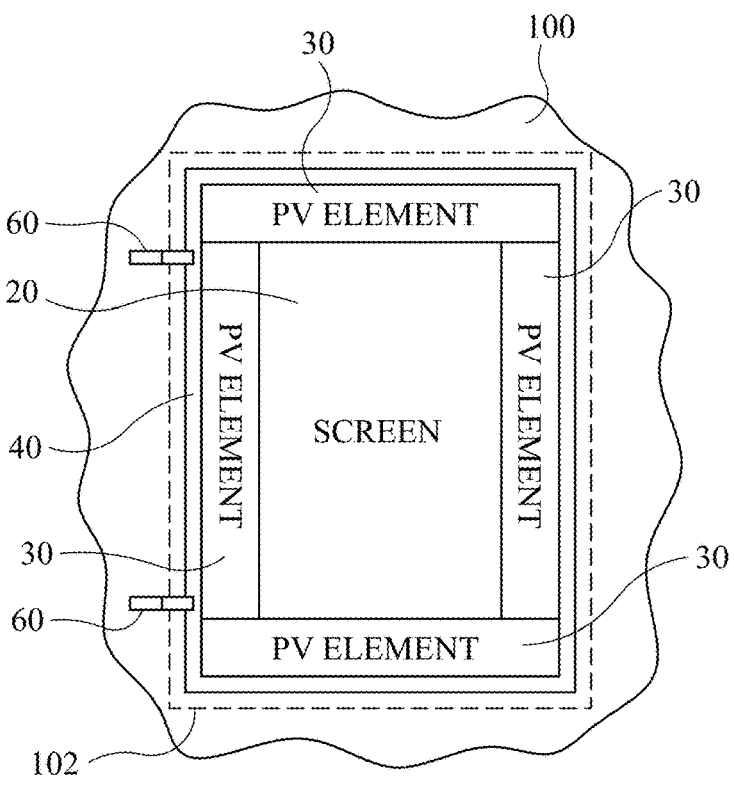
FIG. 6 is a schematic view of another embodiment of a photovoltaic screen system that includes hinges to couple the screen system to a building in accordance with various aspects as described herein.

The PV screen system of the present disclosure may be permanently or removably coupled to a building at an opening thereof as described above. Another option is to incorporate one or more hinges for the mounting of the PV screen system to a building, e.g., a window/door frame, adjacent to a window/door frame, etc. For example and as shown in FIG. 6, hinges 60 may be coupled to fame 40 and to building 100 so that the PV screen system may be pivoted away from the opening 102 to allow access/ingress/egress from a window or door (not shown) provided at the opening 102. It is to be understood that a variety of hinges, their placements, etc., may be used without departing form the scope of the present disclosure. In some embodiments, the PV screen system may be configured like shutters such that the PV screen system is split down the middle for pivoting to opposing sides of the building's opening.

Figure 7A:
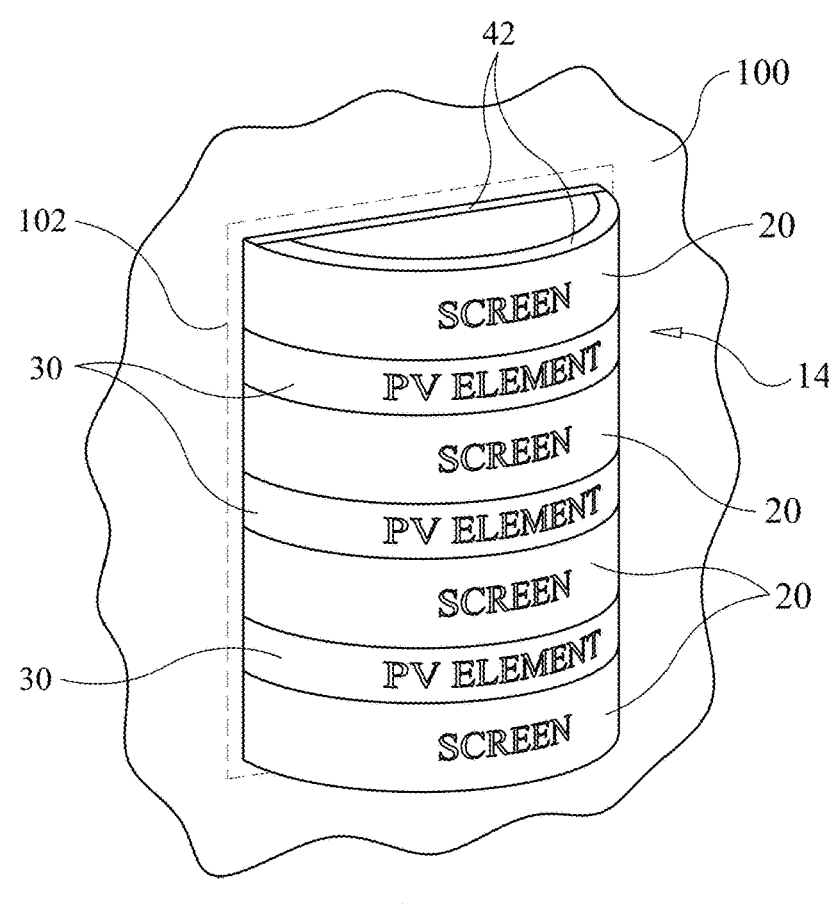
FIG. 7A is a perspective view of another embodiment of a photovoltaic screen system that includes a three-dimensional frame that disposes the screen system's components in a three-dimensional space in accordance with various aspects as described herein.
Figure 7B:
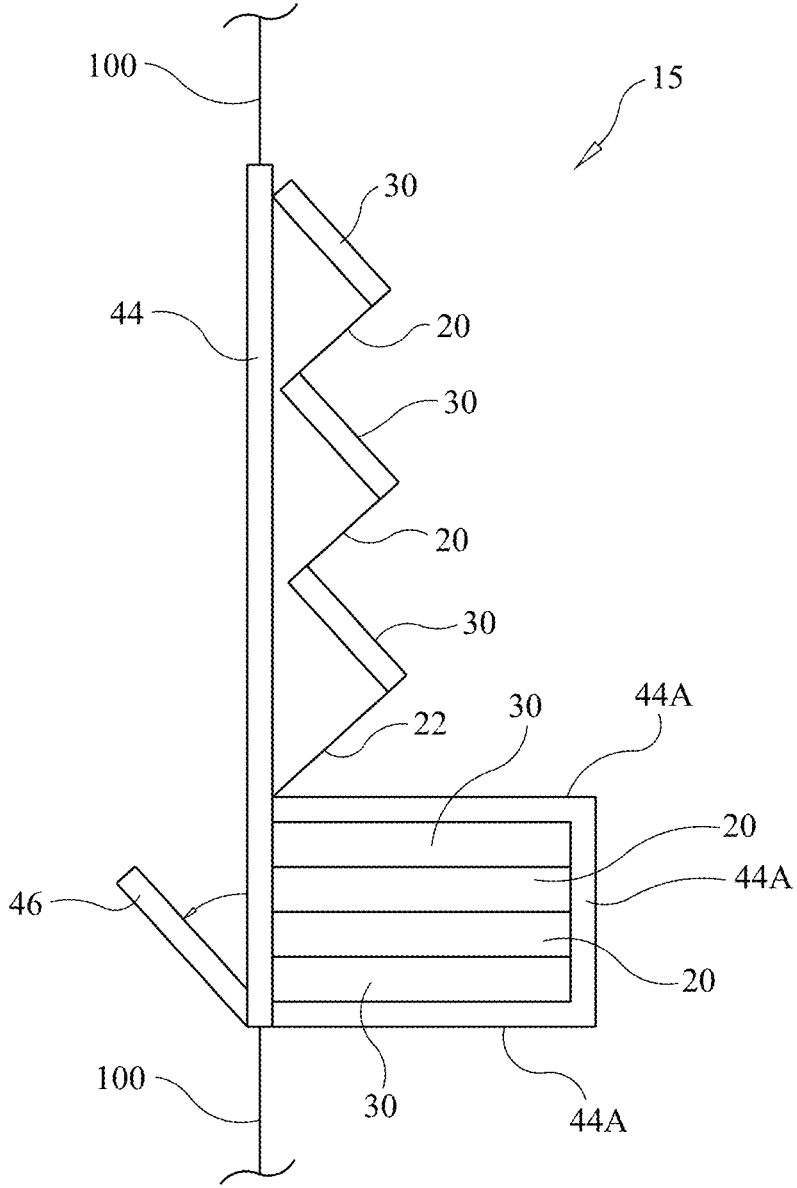
FIG. 7B is a side view of another embodiment of a photovoltaic screen system that includes a three-dimensional frame that disposes the screen system's components in a three-dimensional space in accordance with various aspects as described herein.

In some embodiments, some or all of the fame included with the PV screen system may be configured to dispose the system's screen(s) and PV elements(s) in a three-dimensional space that extends outward from a building's opening. Two such non-limiting examples are illustrated in FIGS. 7A and 7B. With reference to FIG. 7A, a PV screen system 14 includes a frame 42 that creates a semi-cylindrical support system for screens 20 and PV elements 30. It is to be understood that other three-dimensional shapes/geometries may be employed without departing form the scope of the present disclosure. Such three-dimensional shaping of the PV screen system may have a number of goals to include, for example, one or more of optimizing solar energy collection, optimizing light/air passage, and improving building aesthetics. In some embodiments, the three-dimensional frame may include portions that provide ancillary functionality (e.g., creation of a platform or receptacle for support of a decorative item or receiving drone-delivered packages). For example and with reference to FIG. 7B, a PV screen system 15 may include a frame 44 that includes a portion 44A that supports screens 20 and PV elements 30 in a way that defines an open-top receptacle. A door 46 may be provided to give a user access to the receptacle from within the building 100.

Figures 8A, 8B, 8C:
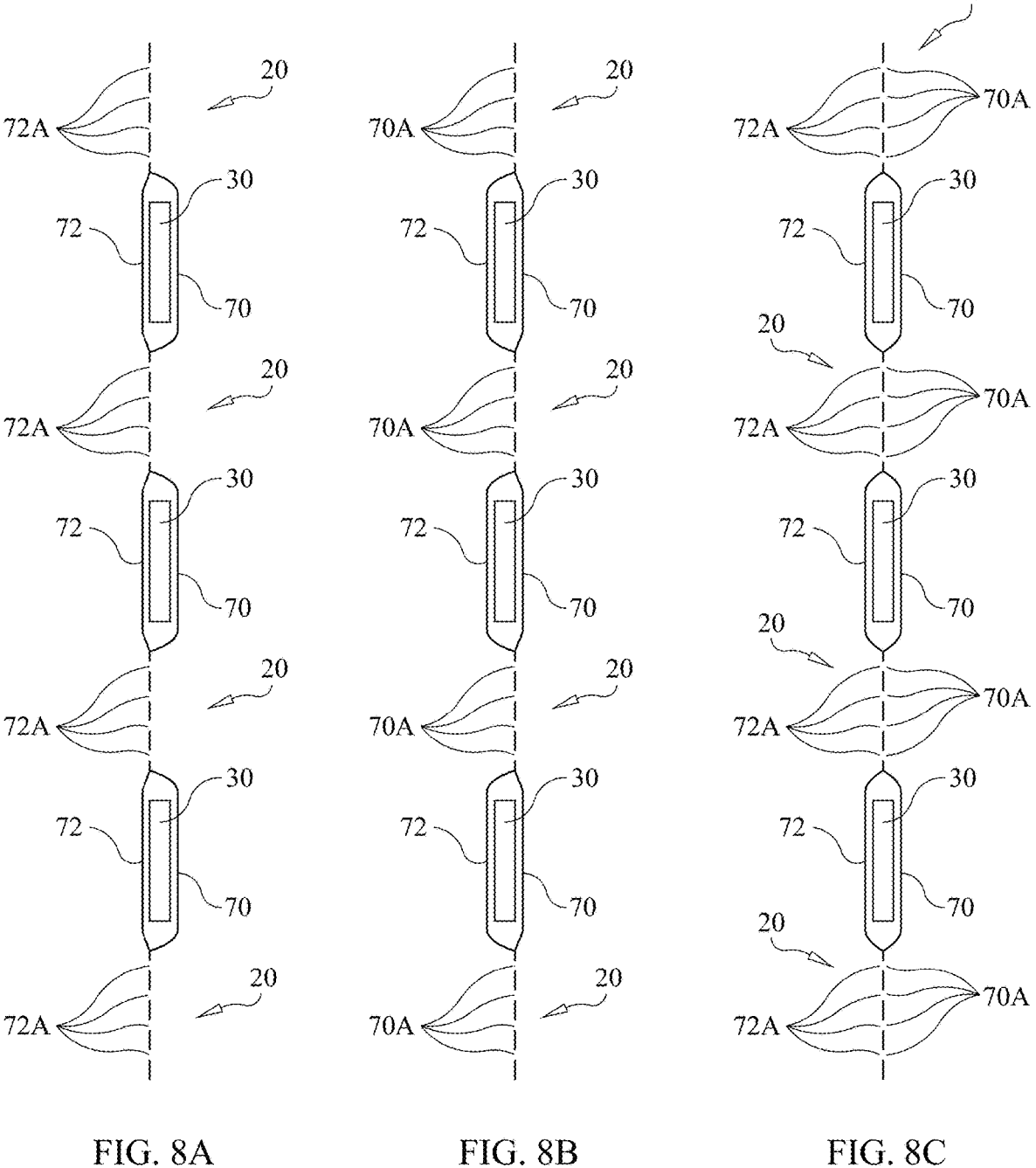
FIG. 8A is a side schematic view of an embodiment of a photovoltaic screen system having encapsulated photovoltaic elements with the encapsulating material being perforated to define a screen in accordance with various aspects as described herein.
FIG. 8B is a side schematic view of another embodiment of a photovoltaic screen system having encapsulated photovoltaic elements with the encapsulating material being perforated to define a screen in accordance with various aspects as described herein.
FIG. 8C is a side schematic view of another embodiment of a photovoltaic screen system having encapsulated photovoltaic elements with the encapsulating material being perforated to define a screen in accordance with various aspects as described herein.

As mentioned previously herein, the screen(s) in the PV screen system may be created during fabrication of the PV screen system. For example, in cases where the PV elements are to be encapsulated for the environmental protection thereof, the encapsulation material (e.g., a film used to encapsulate the PV elements) may also be used to make the screen(s). For example, encapsulation of the PV elements with encapsulation material may simultaneously be used as the material basis for screen region(s) that may then be perforated to create a screen mesh as part of the manufacture of the PV screen system. By way of non-limiting examples, three PV-encapsulation-material-based PV screen systems are illustrated in FIGS. 8A-8C. In each example, PV elements 30 encapsulated by a front side layer 70 (i.e., the layer that will face the outside environment) and a backside layer 72. It is to be understood that at least front side layer 70 provides for the passage of solar energy. In some embodiments, both front side layer 70 and backside layer 72 may provide for the passage of solar energy in cases where PV elements are "bifacial", i.e., capable of collecting solar energy on both faces of the PV element where one face is directly exposed to the solar energy and the other face is indirectly exposed to the solar energy. In some embodiments, backside layer 72 may be a backsheet laminate. As in the previous embodiments, a frame (not shown for clarity of illustration in FIGS. 8A-8C) may be included.

In FIG. 8A, front side layer 70 is fused to backside layer 72 just beyond the peripheral edges of each PV element 30 to thereby surround/encase each of the PV elements, while backside layer 72 is continuous between the spaced-apart PV elements 30. During fabrication, perforations 72A may be generated in the portions of backside layer 72 between PV elements 30 to create screens 20.

In FIG. 8B, backside layer 72 is fused to front side layer 70 just beyond the peripheral edges of each PV element 30 to thereby surround/encase each of the PV elements, while front side layer 70 is continuous between the spaced-apart PV elements 30. During fabrication, perforations 70A may be generated in the portions of front side layer 70 between PV elements 30 to create screens 20.

In FIG. 8C, both front side layer 70 and backside layer 72 are continuous and fused to one another between PV elements 30. Perforations 70A and 72A may be generated simultaneously and in alignment with one another in the fused regions of layers 70 and 72 to create screens 20.

Figure 9:
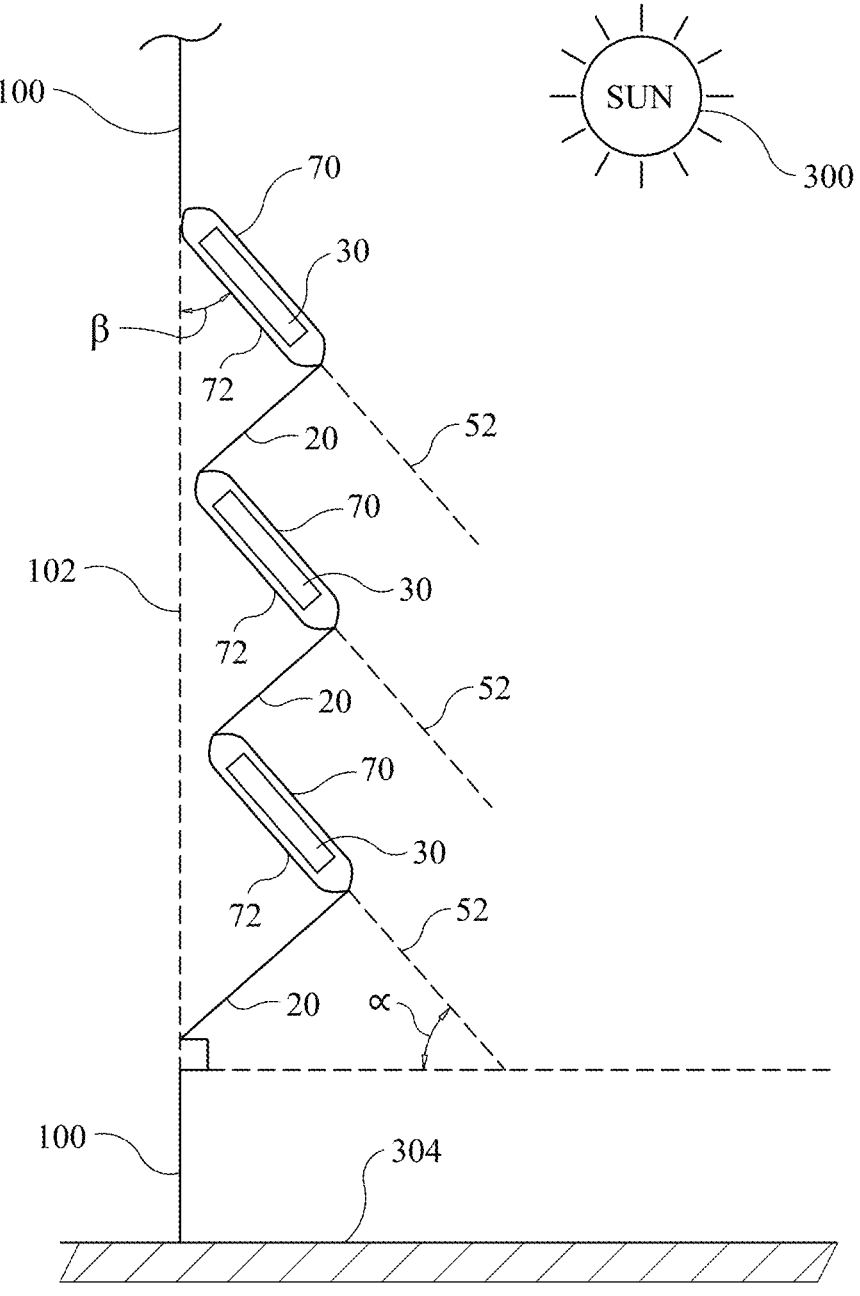
FIG. 9 is a side schematic view of an embodiment of a photovoltaic screen system having encapsulated photovoltaic elements with the encapsulating material being perforated to define a screen and with its photovoltaic elements angled to tilt skyward in accordance with various aspects as described herein.

The above-described PV-encapsulation-material-based PV screen system may be configured with the screen and PV elements disposed in or sharing the same planar space as illustrated in each of the embodiments shown in FIGS. 8A-8C. However, in some embodiments, the screens and PV elements may be positioned to occupy a non-planar space as shown in FIG. 9 where PV elements 30 may be arranged in the above-described parallel planes 52 with each plane 52 being at an acute angle α relative to a horizontal plane 302 such that the PV elements 30 are tilted skyward towards the sun 300.

Figure 10:
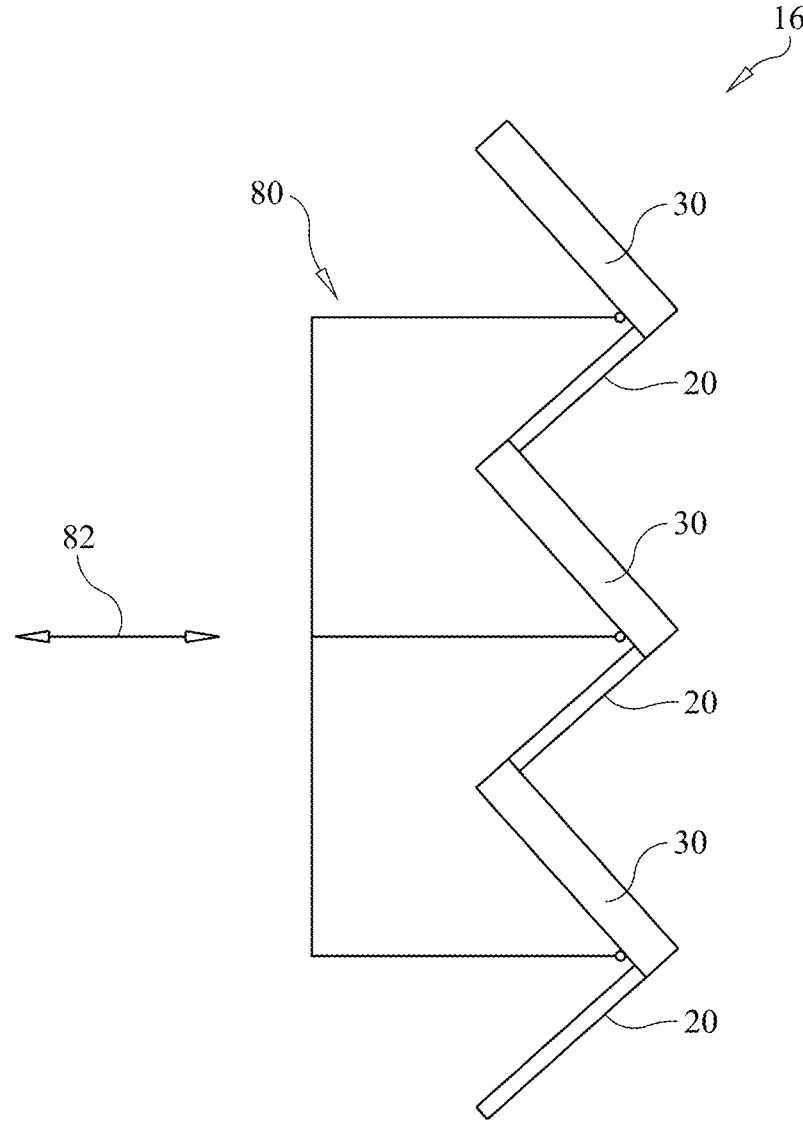
FIG. 10 is a side schematic view of an embodiment of a photovoltaic screen system that includes a mechanism for moving the screen system's photovoltaic elements from a planar position to an angled position where the photovoltaic elements tilt skyward in accordance with various aspects as described herein.

As mentioned previously herein, the PV screen system of the present disclosure may include a mechanism (e.g., manually operated, motorized, control-system-based, sensor-based, etc.) to adjust the angular position of the PV screen system's PV elements. Angular adjustment may be made for one or more reasons such as optimizing solar collection for a particular season or throughout the day, improving light or air passage through the system's screens, etc. Accordingly, FIG. 10 illustrates a PV screen system 16 that includes a PV element adjustment mechanism 80 coupled to, for example, the system's PV elements 30. Adjustment mechanism 80 may be operable to change the acute angle α depending on the position of mechanism 80 in the directions indicated by two-headed arrow 82.

Figure 11A:
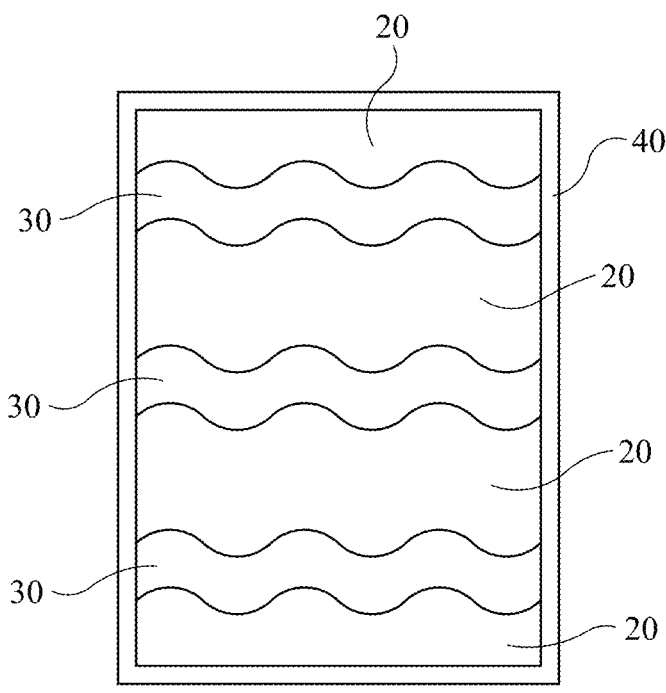
FIG. 11A is a schematic view of an embodiment of a photovoltaic screen system having its photovoltaic elements shaped as decorative strips in accordance with various aspects as described herein.
Figure 11B:
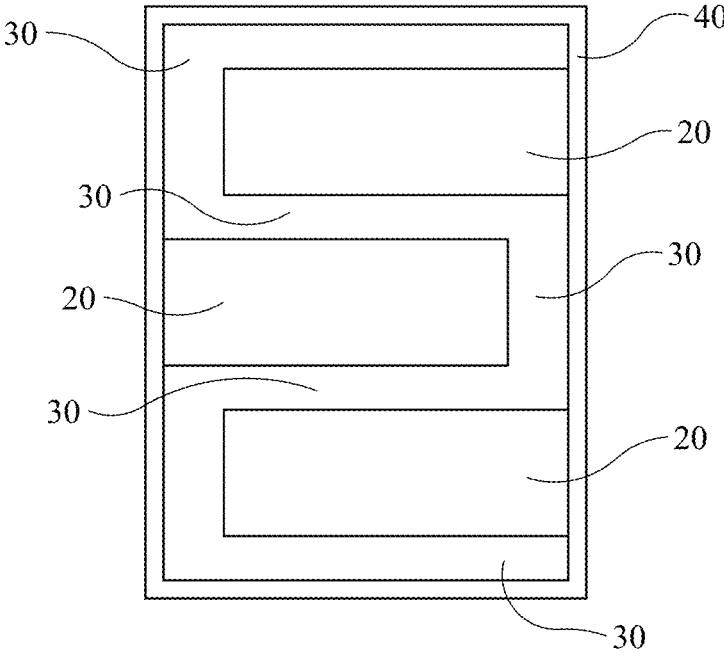
FIG. 11B is a schematic view of another embodiment of a photovoltaic screen system having its photovoltaic elements arranged in a decorative pattern in accordance with various aspects as described herein.

In addition to their utility, the PV elements used in a PV screen system may also be configured to provide decorative functionality. For example, the screens may be colored. Further and with reference to FIG. 11A, PV elements 30 may be decoratively-shaped strips. In FIG. 11B, linear PV elements 30 are arranged in a decorative pattern. In some embodiments, the system's PV elements may be configured to convey a message such as a company's name, logo, etc. Such messaging could be conveyed across a building's wall or region thereof. In some embodiments, the system's screens and/or PV elements may include phosphorescent material (e.g., outlining a shaped PV element) to glow at night.

The advantages of the methods and systems described herein are numerous. The PV screen system will allow whole new classes of users to implement a solar energy component to their electric energy supply. The PV screen systems provide an affordable and easily deployed option to extend the benefits of solar power, while also protecting a building's occupants against insect-borne diseases which is a major concern in many underserved communities around the world. In addition, the PV screen system's PV elements may be tilted at an energy-optimizing angle and are not limited to the fixed pitch of existing roof lines. From renters to commercial building owners, the PV screen systems described herein may be adapted to provide small or large amounts of electric power generated from solar energy. The cumulative effect of even small users of the PV screen systems will go a long way to increasing the world's use of renewable energy.

Although the methods and systems presented herein have been described for specific embodiments thereof, there are numerous variations and modifications that will be readily apparent to those skilled in the art in light of the above teachings. It is therefore to be understood that, within the scope of the appended claims, the methods and systems presented herein may be practiced other than as specifically described.

What is claimed as new and desired to be secured by Letters Patent of the United States is:

1. A photovoltaic screen system, comprising:
an integrated structure adapted to be disposed over an opening in a wall of a building, said integrated structure including
a screen that is permeable to light and air,
a photovoltaic (PV) element coupled to a portion of said screen, and
a frame coupled to said screen and said PV element, said frame adapted to be attached to the building, said frame including a portion occupying a three-dimensional geometry extending outward from the opening in the wall wherein said screen and said PV element lie along a perimeter of said three-dimensional geometry; and
a door coupled to said frame and operable from inside the building to provide access to an interior region of said three-dimensional geometry.

2. The photovoltaic screen system of claim 1, wherein said PV element comprises a strip of PV material.

3. The photovoltaic screen system of claim 1, wherein said portion occupying said three-dimensional geometry comprises a receptacle.

4. The photovoltaic screen system of claim 1, wherein a shape of said three-dimensional geometry is operable to optimize solar energy collection by said PV element.

5. A photovoltaic screen system, comprising:
an integrated structure including
a screen that is permeable to light and air, and
a set of photovoltaic (PV) elements, each of said PV elements coupled to and in direct contact with said screen, wherein said PV elements are separated by exposed portions of said screen,
a frame coupled to said screen and said PV elements, said frame adapted to be attached to a building, said frame including a portion occupying a three-dimensional geometry extending outward from an opening in a wall wherein said screen and said PV elements lie on a periphery of said three-dimensional geometry; and
a door coupled to said frame and operable from inside the building to provide access to an interior region of said three-dimensional geometry.

6. The photovoltaic screen system of claim 5, wherein said PV elements comprise strips of PV material.

7. The photovoltaic screen system of claim 5, wherein said portion occupying said three-dimensional geometry comprises a receptacle.

8. The photovoltaic screen system of claim 5, wherein a shape of said three-dimensional geometry is operable to optimize solar energy collection by said PV elements.

9. The photovoltaic screen system of claim 5, wherein the building is disposed on a ground surface, said integrated structure further including:

a second portion of said frame extending above said portion occupying said three-dimensional geometry, said second portion of said frame lying adjacent to the opening in the wall, a second screen coupled to said second portion of said frame, said second screen being permeable to light and air, and a set of second photovoltaic (PV) elements coupled to said second portion of said frame, each of said second PV elements coupled to and in direct contact with said second screen, wherein said second PV elements are separated by exposed portions of said second screen, said second PV elements lying in parallel planes, each of said second PV elements lying between said exposed portions of said second screen coupled at an upper horizontal edge thereof to said second screen and coupled at a lower horizontal edge thereof to said second screen, each of said parallel planes forming an identical acute angle of inclination with respect to a horizontal plane perpendicular to the vertical wall of the building, wherein all said second PV elements are tilted to face skyward in the same direction, and wherein said exposed portions of said second screen are tilted to face towards the ground surface at the exterior of the building wherein light and air pass through said exposed portions of said second screen.

10. The photovoltaic screen system of claim 9, wherein said portion occupying said three-dimensional geometry comprises a receptacle.

11. A photovoltaic screen system, comprising:

an integrated structure including a set of screens, each of said screens being permeable to light and air, and a set of photovoltaic (PV) elements, said screens and said PV elements disposed in an arrangement in which said screens and said PV elements alternate with one another, an open-top receptacle including a frame coupled to said screens and said PV elements, said frame adapted to be attached to a building, said open-top receptacle occupying a three-dimensional geometry extending outward from an opening in a wall wherein said screens and said PV elements lie on a peripheral portion of said open-top receptacle that extends outward from the opening in the wall.

12. The photovoltaic screen system of claim 11, further comprising:

a door coupled to said frame and operable from inside the building to provide access to said open-top receptacle.

13. The photovoltaic screen system of claim 11, wherein said PV elements comprise strips of PV material.

14. The photovoltaic screen system of claim 11, wherein a shape of said three-dimensional geometry is operable to optimize solar energy collection by said PV elements.

15. The photovoltaic screen system of claim 11, wherein the building is disposed on a ground surface, said integrated structure further including:

said frame having a portion extending above said open-top receptacle adjacent to the opening in the wall, a set of second screens coupled to said portion of said frame, each of said second screens being permeable to light and air, and a set of second photovoltaic (PV) elements coupled to said portion of said frame, each of said second PV elements coupled to and in direct contact with two of said second screens, said second screens and said second PV elements disposed in an arrangement above said open-top receptacle in which said second screens and said second PV elements alternate with one another, said second PV elements lying in parallel planes, each of said parallel planes forming an identical acute angle with a horizontal plane perpendicular to the wall of the building wherein all said second PV elements face skyward in the same direction, and each of said second PV elements lying between two of said second screens coupled at an upper horizontal edge thereof to one of said second screens and coupled at a lower horizontal edge thereof to another of said second screens wherein said second screens are tilted to face towards the ground surface at the exterior of the building.

* * * * *